(12) United States Patent
Wang et al.

(10) Patent No.: US 8,735,207 B2
(45) Date of Patent: May 27, 2014

(54) METHOD TO AVOID FIXED PATTERN NOISE WITHIN BACKSIDE ILLUMINATED (BSI) COMPLEMENTARY METAL-OXIDE-SEMICONDUCTOR (CMOS) SENSOR ARRAY

(75) Inventors: Chung Chien Wang, Shanhua Township, Tainan County (TW); Yeur-Luen Tu, Taichung (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 305 days.

(21) Appl. No.: 13/079,995

(22) Filed: Apr. 5, 2011

(65) Prior Publication Data

US 2012/0258564 A1    Oct. 11, 2012

(51) Int. Cl.
   *H01L 31/18*  (2006.01)
   *H01L 21/306*  (2006.01)
   *H01L 27/146*  (2006.01)

(52) U.S. Cl.
   CPC ...... *H01L 27/1464* (2013.01); *H01L 27/14687* (2013.01); *H01L 27/14698* (2013.01)
   USPC ............. 438/70; 438/459; 257/E21.219

(58) Field of Classification Search
   CPC ............... H01L 27/1464; H01L 27/14687; H01L 27/14698
   USPC ............. 438/69, 70, 459; 257/E21.219
   See application file for complete search history.

(56) References Cited

U.S. PATENT DOCUMENTS

| | | | |
|---|---|---|---|
| 2007/0251930 A1* | 11/2007 | Liu et al. | 219/121.82 |
| 2008/0227276 A1* | 9/2008 | Shiau et al. | 438/542 |
| 2008/0316386 A1* | 12/2008 | Ting et al. | 349/43 |
| 2009/0219548 A1* | 9/2009 | Kawakami et al. | 356/615 |
| 2010/0193826 A1* | 8/2010 | Kim | 257/99 |

* cited by examiner

*Primary Examiner* — Alexander Ghyka
(74) *Attorney, Agent, or Firm* — Haynes and Boone, LLP (57) ABSTRACT

The present disclosure provides one embodiment of a method. The method includes providing a semiconductor substrate having a front side and a backside, wherein the front side of the semiconductor substrate includes a plurality of backside illuminated imaging sensors; bonding a carrier substrate to the semiconductor substrate from the front side; thinning the semiconductor substrate from the backside; performing an ion implantation to the semiconductor substrate from the backside; performing a laser annealing process to the semiconductor substrate from the backside; and thereafter, performing a polishing process to the semiconductor substrate from the backside.

20 Claims, 8 Drawing Sheets

Fig. 12

METHOD TO AVOID FIXED PATTERN NOISE WITHIN BACKSIDE ILLUMINATED (BSI) COMPLEMENTARY METAL-OXIDE-SEMICONDUCTOR (CMOS) SENSOR ARRAY

BACKGROUND

In semiconductor technologies, backside illuminated image sensors (BSIs) are used for sensing a volume of light projected towards a backside surface of a substrate. During fabrication of BSIs, an ion implantation is applied to the backside of the substrate, and a laser annealing process is further applied to the backside of the substrate to activate the implanted dopant. Either a scan-type laser or a step-type laser may be used to perform the annealing process after the ion implantation. However, when the scan-type laser source is used, a periodic defect, such as fixed pattern noise (FPN), is introduced into the BSIs. Furthermore, both the scan-type laser and the step-type laser can induce laser boundary image issues. Improvements in backside illuminated image sensors and/or corresponding methods for manufacturing the same are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
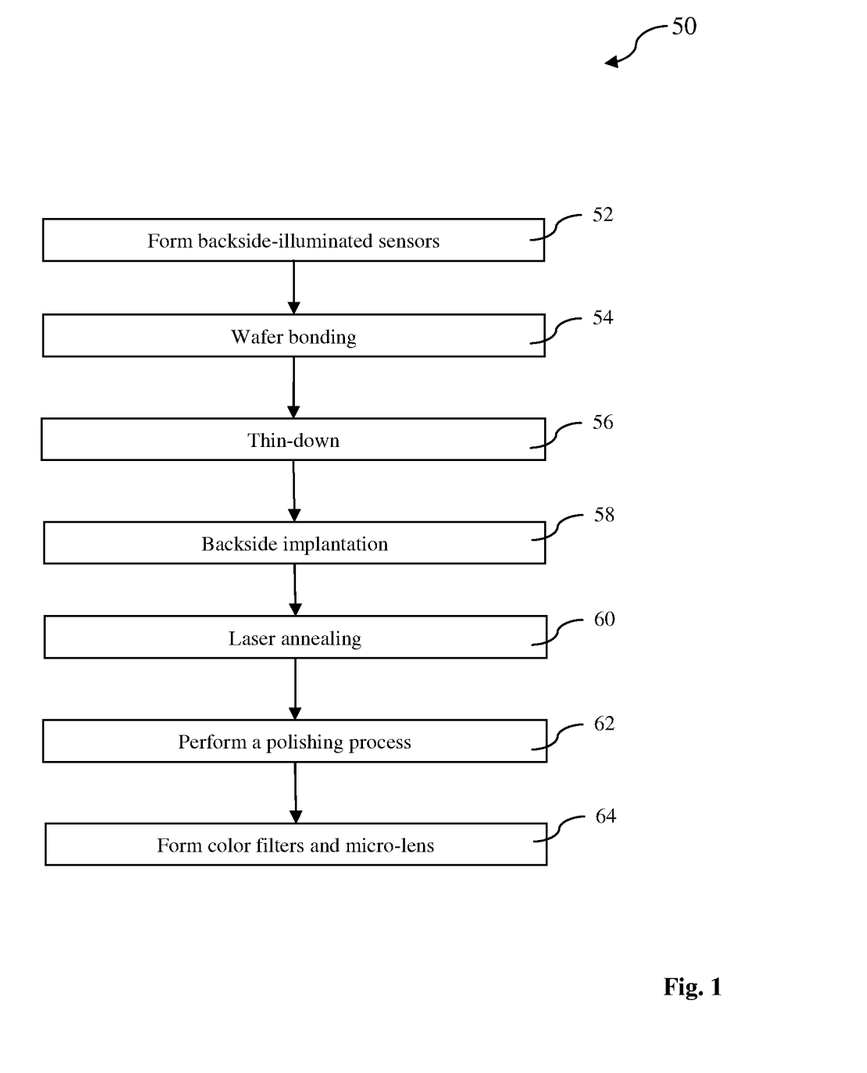
FIG. 1 is a flowchart of a method for making a semiconductor structure having one or more backside illuminated sensors (BSIs) constructed according to aspects of the present disclosure in one or more embodiments.
Figure 6:
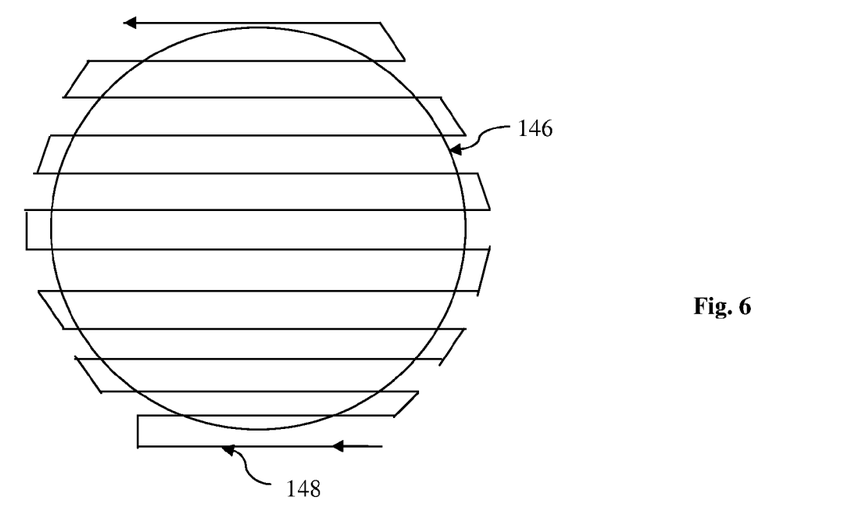
FIG. 6 illustrates a top view of a wafer having BSIs formed thereon and a scan path of a laser annealing process applied to the backside of the wafer according to various aspects of the present disclosure in one embodiment.
Figure 7:
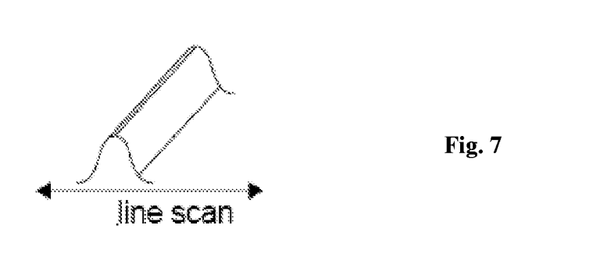
FIG. 7 is a schematic view illustrating a laser beam of the laser source implemented for the laser annealing process according to one embodiment of the present disclosure.
Figure 8:
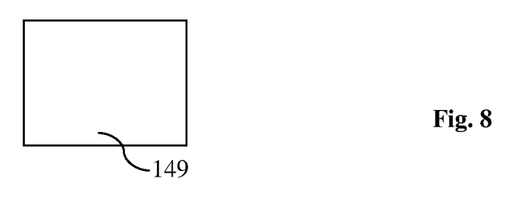
FIG. 8 illustrates shape and dimensions of a laser beam of the laser source used for the laser annealing process constructed according to aspects of the present disclosure in another embodiment.
Figure 9:
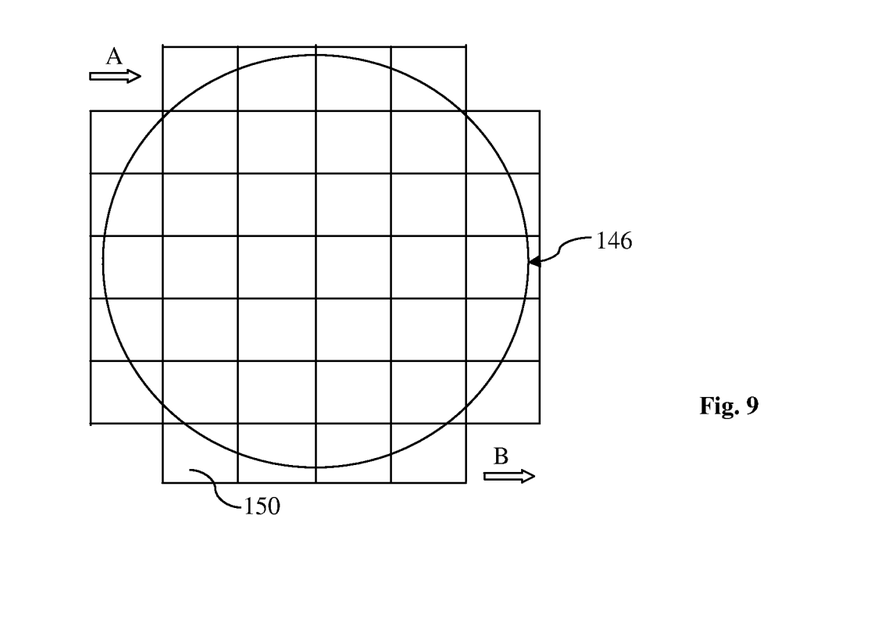
FIG. 9 illustrates a top view of a wafer having BSIs formed thereon and a plurality of fields defined thereon according to various aspects of the present disclosure in one embodiment.
Figure 10:
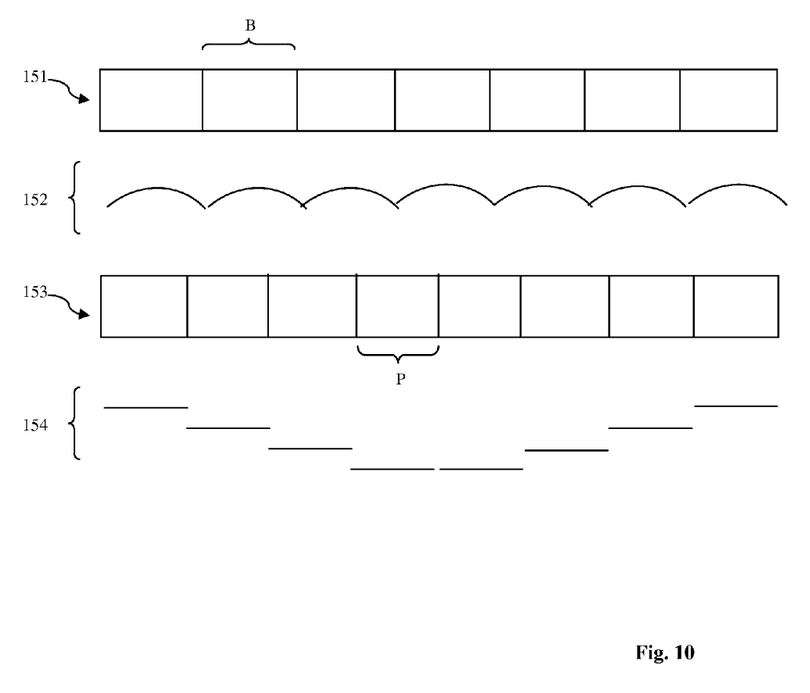
FIG. 10 schematically illustrates a laser beam size of the laser source for the laser annealing process, a surface profile of the backside surface of a wafer, a pixel size of the BSIs, and imaging signals from the BSIs constructed according to aspects of the present disclosure in another embodiment.

FIG. 1 is a flowchart of a method 50 for making a semiconductor structure 100 having one or more backside illuminated sensors (BSIs). FIGS. 2 through 5 and 11 are sectional views of a semiconductor structure 100 at various fabrication stages constructed according to aspects of the present disclosure in one or more embodiments. FIG. 2a illustrates a sectional view of one backside illuminated sensor 104 constructed according to various aspects of the present disclosure in one embodiment. FIG. 2b illustrates a top view of one chip (die) 114 having one or more BSIs formed thereon. FIG. 6 illustrates a top view of a wafer 146 having BSIs formed thereon and a scan path of a laser annealing process applied to the backside of the wafer. FIG. 7 is a schematic view illustrating a laser beam of the laser source implemented for the laser annealing process according to one embodiment of the present disclosure. FIG. 8 illustrates a shape and dimensions of a laser beam of the laser source used for the laser annealing process constructed according to aspects of the present disclosure in another embodiment. FIG. 9 illustrates a top view of a wafer 146 having BSIs formed thereon and a plurality of fields defined thereon. FIG. 10 schematically illustrates a laser beam size of the laser source for the laser annealing process, a surface profile of the backside surface of a wafer, a pixel size of the BSIs, and imaging signals from the BSIs constructed according to aspects of the present disclosure in another embodiment. The semiconductor structure 100 and the method 50 making the same are collectively described below with reference to FIGS. 1 through 11.

Figure 2:
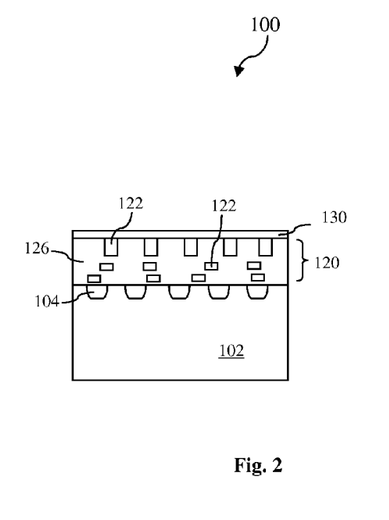
FIGS. 2 through 5 and 11 are sectional views of the semiconductor structure having BSIs at various fabrication stages constructed according to aspects of the present disclosure in one or more embodiments.
Figure 2A:
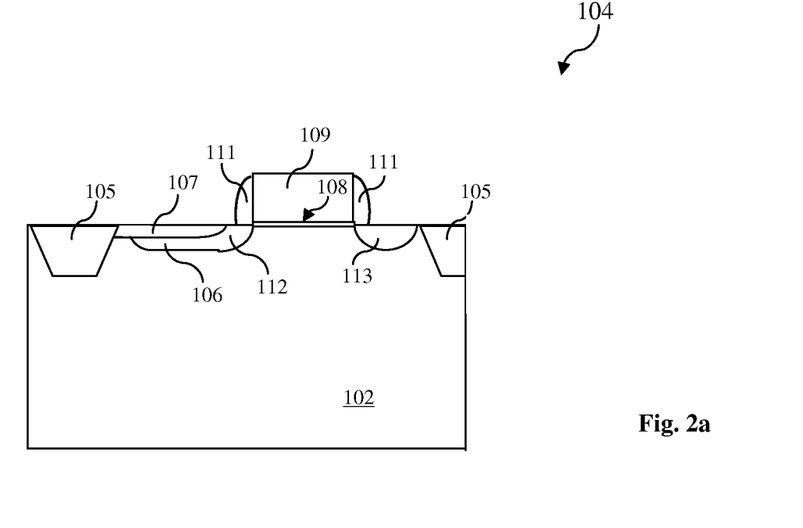
FIG. 2a illustrates a sectional view of one BSI constructed according to various aspects of the present disclosure in one embodiment.
Figure 2B:
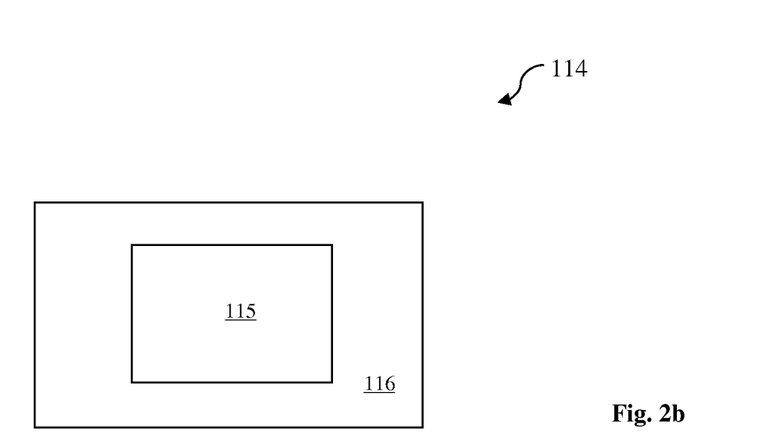
FIG. 2b illustrates a top view of one chip (die) having one or more BSIs formed thereon according to various aspects of the present disclosure in one embodiment.

Referring to FIGS. 1 and 2, the method 50 begins at step 52 by forming, on a semiconductor substrate (or device substrate) 102, one or more backside illuminated sensors (BSIs) 104. The semiconductor substrate 102 includes silicon in a crystalline structure, such as a silicon wafer. The semiconductor substrate 102 may alternatively or additionally include other semiconductor material such as germanium, gallium arsenic, or indium phosphide. The semiconductor substrate 102 includes a front surface (or top surface) and a backside surface (or bottom surface). The semiconductor substrate 102 may include various p-type doped regions and/or n-type doped regions configured and coupled to form various devices and functional features. All doping features are formed on the front surface of the semiconductor substrate 102 and may be formed by various techniques, such as ion implantation or diffusion in various steps. The semiconductor substrate 102 may include other features such as shallow trench isolation (STI) features for isolation. For example, the STI features are formed on the front surface of the semiconductor substrate 102 and are configured to isolate various devices, such as various backside illuminated sensors 104.

The backside illuminated sensors 104 are formed on the semiconductor substrate 102. Particularly, the backside illuminated sensors 104 are formed on the front surface of the semiconductor substrate 102. FIG. 2 illustrates five exemplary backside illuminated sensors 104. The backside illuminated sensors 104 include an image-sensing region (or light-sensing region) which may be a doped region having a n-type or p-type dopant formed in the semiconductor substrate 102. In the present embodiment, the backside illuminated sensors 104 include a complimentary metal-oxide-semiconductor (CMOS) image sensor. Other examples of the backside illuminated sensors 104 may include a photodiode, a charged coupling device (CCD) sensor, an active sensor, a passive sensor, and/or other types of devices diffused or otherwise formed in the semiconductor substrate 102. As such, the backside illuminated sensors 104 may include conventional and/or future-developed image sensing devices.

A backside illuminated sensor 104 is provided in FIG. 2a as a sectional view and is constructed according to various aspects in one or more embodiments. The backside illuminated sensor 104 is formed on the front surface of the semiconductor substrate 102. A plurality of isolation features 105 such as STI features are formed in the semiconductor substrate 102 to define various active regions for image sensors, various transistors, and other functional features. The STI features 105 may be formed by a suitable technique known in the art. For example, the STI features may be formed by a set of processes including patterning the semiconductor layer by a conventional photolithography, etching the semiconductor layer by a plasma etching process to form various trenches, and filling the trenches by a dielectric material, such as silicon oxide by a chemical vapor deposition (CVD) process.

The backside illuminated sensor 104 includes a first doped region 106. If the semiconductor substrate 102 includes a first type of dopant. The backside illuminated sensor 104 includes a second type of dopant different from the first type of dopant. For example, when the first type of dopant is negative (n-type) dopant, then the second type of dopant in the first doped region 106 is positive type (p-type) dopant. Boron or BF2 may be utilized to introduce p-type dopant. The backside illuminated sensor 104 may further include a second doped region 107 with the first type of dopant. The second doped region 107 is formed on the first doped region 106 and may be extended out of the first doped region 106 to have direct contact to the semiconductor substrate 102 with the first type of dopant. The first doped region 106 of the second type dopant and the semiconductor substrate 102 of the first type dopant forms a photodiode configured to receive and be responsive to the projected light.

In one embodiment, the backside illuminated sensor 104 may further include a gate dielectric 108 disposed on the semiconductor substrate 102, a gate electrode 109 disposed on the gate dielectric 108, and optional gate spacers 111 disposed on the sides of the gate stack (the gate dielectric and gate electrode). In furtherance of the embodiment, the backside illuminated sensor 104 also includes a source (S) region 112 and a drain (D) region 113. The source and drain regions have the second type of dopant. The gate electrodes and S/D regions are configured to form a CMOS transistor and are coupled to the adjacent photodiode. Particularly, the S/D region 112 may be coupled with the first doped region 106 of the photodiode and may be formed simultaneously with the first doped region 106. In one embodiment, the CMOS transistor may be used as a transfer gate transistor. Alternatively, the backside illuminated sensor 104 may include a combination of a transfer gate transistor, a reset gate transistor, a source follower, and a row select transistor. The image sensor 104 in FIG. 2a is provided here only for example.

Referring back to FIG. 2, the semiconductor structure 100 may include a plurality of backside illuminated sensors 104 properly configured. Particularly, the semiconductor substrate 102 includes a plurality of chips (dies). Each chip includes an imaging device having one or more backside illuminated sensors 104 configured in an array. FIG. 2b illustrates a top view of a portion of the semiconductor structure 100 of FIG. 2. Specifically, FIG. 2b illustrates a chip 114 defined in the semiconductor structure 100. The chip 114 includes a sensor area 115 and a peripheral area 116 surrounding the sensor area 115. In the present embodiment, the sensor area 115 includes one or a plurality of backside illuminated sensors 104, such as the backside illuminated sensor illustrated in FIG. 2a. The plurality of backside illuminated sensors 104 are configured as an array for proper imaging effect. The periphery area 116 includes a peripheral circuit coupled with the backside illuminated sensors 104 in the sensor area 115 to enable functionality of the imaging device.

Still referring to FIG. 2, other features may be further formed on the semiconductor substrate 102. For example, a multilayer interconnect (MLI) structure 120 is formed on the front surface of the semiconductor substrate 102. The MLI structure 120 includes conductive wires electrically coupled to the backside illuminated sensors 104 to form functional imaging devices. The backside illuminated sensors 104 can properly respond to illuminated light (such as catching an image). The MLI structure 120 is disposed on the front surface of the semiconductor substrate 102 and is overlying the backside illuminated sensors 104. The MLI structure 120 includes various conductive features 122, such as metal lines for horizontal wiring and vias/contacts for vertical wiring. In one embodiment, the MLI structure 120 includes conductive materials such as aluminum, aluminum/silicon/copper alloy, titanium, titanium nitride, tungsten, polysilicon, metal silicide, or combinations thereof, which may be referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connections (via and contact) and horizontal connections (conductive line). Still other manufacturing processes such as thermal annealing may be used to form metal silicide. In another embodiment, copper multilayer interconnects may be used and the MLI structure 120 may include copper, copper alloy, titanium, titanium nitride, tantalum, tantalum nitride, tungsten, polysilicon, metal silicide, or combinations thereof. The copper multilayer interconnect may be formed by a technique including CVD, sputtering, plating, or other suitable processes.

An interlayer dielectric (inter-level dielectric or ILD) 126 is disposed to isolate the multilayer interconnect. The interlayer dielectric structure 126 may include silicon oxide, silicon nitride, silicon oxynitride, polyimide, fluoride-doped silicate glass (FSG), carbon doped silicon oxide, low-k dielectric material, and/or other suitable materials. The ILD 126 may be formed by a technique including spin-on coating, CVD, sputtering, or other suitable processes.

A metal layer 130 is further formed on the front surface of the semiconductor substrate 102 for wafer bonding. In one embodiment, the metal layer 130 includes gold (Au). In other embodiments, the metal layer 130 includes a metal or metal alloy selected from the group consisting of Au, copper (Cu), indium (In), aluminum (Al), tin (Sn), titanium (Ti), palladium (Pd), nickel (Ni), and proper combinations thereof.

Figure 3:
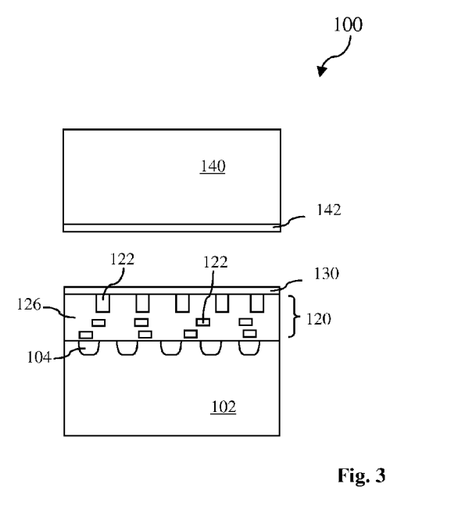
Figure 4:
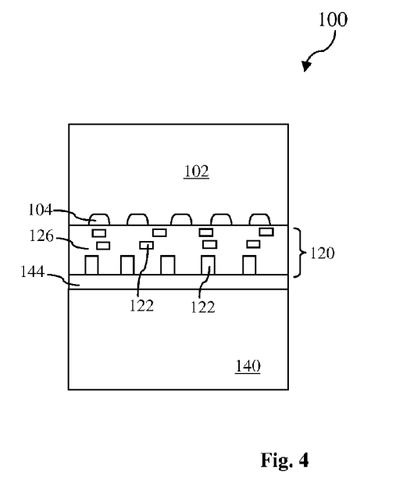

Referring to FIG. 1, the method 50 proceeds to step 54 for wafer bonding. A carrier substrate 140 is bonded to the semiconductor substrate 102 from the front surface, as illustrated in FIG. 3. In various embodiments, the carrier substrate 140 may include a silicon wafer, a ceramic substrate, or a metal substrate. Particularly, a metal layer 142 is formed on the carrier substrate 140. The carrier substrate 140 and the semiconductor substrate 102 are bonded together through the metal layer 130 and the metal layer 142 with a proper bonding mechanism, such as eutectic bonding. The metal layer 142 includes a metal paired with the material of the metal layer 130 enabling the eutectic bonding or other proper bonding mechanism. In a more particular example, the metal layer 130 and the metal layer 142 use a pair of materials, such as gold and tin, respectively. Other pairs of materials include gold (Au) and indium (In), copper (Cu) and copper (Cu), aluminum (Al) and tin (Sn), titanium (Ti) and aluminum (Al), and aluminum (Al) and nickel (Ni). In other embodiments, non-metal material may be used for wafer bonding, such as aluminum (Al) and germanium (Ge), or aluminum (Al) and silicon (Si). During the wafer bonding, a thermal treatment is applied to the metal layers 130 and 142. A mechanical force may be further applied to bond the semiconductor substrate 102 and the carrier substrate 140. The semiconductor structure 100 after the wafer bonding at step 54 is illustrated in FIG. 4. In FIG. 4, the metal layers 130 and 142 after bonding together are collectively referred to as a bonding layer 144.

Figure 5:
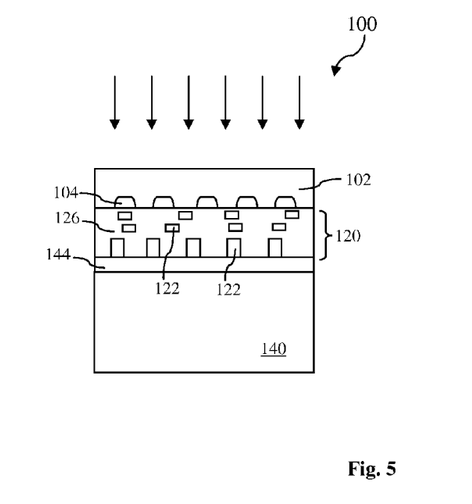

Referring to FIGS. 1 and 5, the method 50 proceeds to step 56 by thinning down the semiconductor substrate 102 from the backside surface. The thickness of the semiconductor substrate 102 is substantially reduced by the thinning-down to enhance imaging efficiency and quality. In one example, the thickness of the semiconductor substrate 102 is reduced to a thickness less than about 10 micron. The thinning-down can be achieved by a mechanical mechanism (such as grinding), a chemical mechanism (such as wet etching), or combinations thereof.

Referring to FIGS. 1 and 5, the method 50 proceeds to step 58 by performing an ion implantation to the backside of the semiconductor substrate 102. The backside ion implantation at step 58 can enhance quantum efficiency of the backside illuminated sensors 104. In the present embodiment, p-type impurities are introduced into the backside of the semiconductor substrate 104. The p-type impurities include boron or other suitable impurities. The p-type impurities create an electrical field to drive photoelectrons toward the front side of the semiconductor substrate 104. In the present embodiment, a shallow p+ boron implanted layer is formed by a boron implantation. In one example, the implanted boron is distributed in the backside surface of the semiconductor substrate 102 with a depth of about 1000 angstrom. In another example, the boron ion implantation is implemented with an implantation energy greater than about 5 KeV and an implantation dosage ranging between about $1 \times 10^{13}$ and about $1 \times 10^{15}$.

Still referring to FIGS. 1 and 5, the method 50 proceeds to step 60 by thereafter performing a laser annealing process to the backside of the semiconductor substrate 102. The laser annealing process is designed to activate the p-type implanted impurities. Particularly, the laser annealing process is designed to provide enough thermal energy to liquidize and re-crystallize the backside implanted portion of the semiconductor substrate 102 for impurity activation.

The laser beam is applied to the backside of the semiconductor substrate in a scan mode. In one example, the laser beam is scanned to the backside of the semiconductor substrate 102 through a raster scan. FIG. 6 illustrates a schematic view of the scan mode of the laser beam. A laser beam scans through a semiconductor wafer 146 through an exemplary path 148. In the laser scan path, the laser beam scans through the semiconductor wafer 146 line by line in parallel. The distance between the adjacent lines are properly chosen such that the laser annealing process can effectively activate the implanted impurities even in regions between the adjacent scan lines. In the present embodiment, the semiconductor wafer 146 includes the semiconductor structure 100. FIG. 7 illustrates a schematic laser beam with a scan direction along the "line scan". In a particular example, the laser beam has a beam line shape with a width of about 7 micron and a length of about 27 mm. The laser beam has an energy density unevenly distributed, such as a Gaussian distribution. The adjacent scan lines have a certain overlap to effectively activate the implanted impurities.

In one embodiment, the laser source for the laser annealing process includes a pulsed solid state laser source. For example, the pulsed solid state laser source may have a short wavelength of about 515 nm. In another example, the pulsed solid state laser source may have about 104 pulses per second or a pulse rate of about 10 KHz. In yet another example, the pulsed solid state laser source has a pulse duration ranging between about 300 ns and about 500 ns. In yet another example, the pulsed solid state laser source has an energy density ranging between about 0.5 J/cm$^2$ and about 3 J/cm$^2$. In yet another example, the pulsed solid state laser source uses a ytterbium-doped yttrium aluminium garnet (Yb:YAG). In one particular example, the laser source uses a Yb:YAG pulsed solid state laser source from DSPP Lasers Inc.

In an alternative embodiment, the laser annealing process is implemented in a step and shot mode. In this case, the laser beam covers a large area S referred to as a laser beam area (or beam size). In one example, the laser beam area is a square area 149, as illustrated in FIG. 8. In one particular example, the laser beam area is a square area of about 15 mm by 15 mm. In the step and shot mode, a plurality of fields 150 are defined to the semiconductor wafer 146. Each of the fields 150 is equal to the laser beam area 149. The laser beam is stepped to one of the fields 150, and then exposes the field in a shot (such as one pulse). Then the laser beam is stepped to another one of the fields 150 and then exposes that field in one shot. Repeat step and shot until the plurality of fields 150 are exhausted. The stepping is implemented in a certain step path. For example, the step and shot starts at "A" through the fields 150 in the first row from left to right, then through the fields 150 in the second row from right to left, then through the third row, and so on until the plurality of fields 150 are exhausted and ends at "B". In one embodiment, the wafer stage to hold the wafer 146 is operable to move the wafer 146 such that the laser beam is relatively stepped to one field of the wafer 146.

The laser source used for the step and shot mode during the laser annealing process includes a pulsed solid state laser source. In one embodiment, the laser source uses an excimer laser of XeCl. In furtherance of the present embodiment, the laser source has a short wavelength of about 308 nm. The laser source may have about 2 pulses per second or a pulse rate of about 2 Hz. In another example, the laser source has a pulse duration of about 150 ns. In yet another example, the laser source has an energy density ranging between about 1 J/cm$^2$ and about 3 J/cm$^2$. In one example, the laser source has a beam size of about 15 mm by 15 mm. In another example, the laser source has a beam size of about 2 mm by 2 mm. By implementing the laser annealing process in the step and shot mode, fixed pattern noise (FPN) issues can be eliminated. In another embodiment, the beam size is properly chosen such that the fields 150 defined on the wafer 146 cover one or more chips and the corresponding laser boundary regions fall into the periphery area 116 (see FIG. 2b) without impacting imaging effect of the backside imaging sensors 104 in the sensor area 115 (see FIG. 2b).

In another alternative embodiment, the laser annealing process implements a laser annealing in a scan and vibration mode. In the scan and vibration mode, the laser annealing apparatus is designed and configured to provide a vibration mechanism such that the laser beam vibrates in a direction perpendicular to the scan direction during laser scanning. The vibration of the laser beam has a vibration frequency high enough to eliminate the FPN issue. In one example, the laser source uses a Yb:YAG pulsed solid state laser source from DSPP Lasers Inc. The corresponding pulse rate is 10 KHz, and the vibration frequency of the laser beam is 10 KHz or higher. The vibration may be achieved by a proper mechanism such as through piezoelectric effect.

Still referring to FIGS. 1 and 5, the method 50 proceeds to step 62 by performing a polishing process to the backside of the semiconductor substrate 102 after the laser annealing process at step 60. Due to the boundary and/or FPN issues caused by the laser annealing process, the backside surface of the semiconductor substrate 102 has an uneven surface profile that will reduce imaging efficiency and quality. The polishing process is performed at step 62 to effectively remove the uneven portion of the impurity implanted backside of the semiconductor substrate 102. In one embodiment, if the implanted backside of the semiconductor substrate 102 has a thickness T, then the removed portion by the polishing process has an average thickness of about 50% T or less. For example, if the implanted backside of the semiconductor substrate 102 has a thickness of about 1000 angstrom, then the removed portion by the polishing process has an average thickness of about 500 angstrom or less. In one embodiment, the polishing process includes a chemical mechanical polishing (CMP) process applied to backside of the semiconductor substrate 102. Other polishing processes may be alternatively used to achieve similar polishing effects to eliminate FPN and/or laser boundary issues.

By implanting the laser annealing process in the step and shot mode or in the scan and vibration mode, the FPN issue is eliminated. By implanting the polishing process after the laser annealing process, both the FPN and laser boundary issues are eliminated. The FPN is further explained with reference to FIG. 10. A beam size 151 of the laser annealing process is "B", such as 2 micron in one example. A surface roughness 152 of the backside surface of the semiconductor substrate 102 is schematically illustrated in FIG. 10, corresponding to the beam size. A pixel size 153 of the backside illuminated sensors 104 is "P", such as 1.75 micron in one example. An imaging signal 154 of the backside illuminated sensors 104 is illustrated in FIG. 10, corresponding to the pixel size. Due to the existence of the common multiples between the beam size B and the pixel size P, the imaging signal will change periodically, introducing a fixed pattern noise. By implementing the laser annealing process in the step and shot mode or the scan and vibration mode, the FPN issue is eliminated. By implementing the polishing process after the laser annealing process, both the FPN and laser boundary issues are eliminated.

In another embodiment, the beam size B and the pixel size P are properly designed such that there is no common multiples between the beam size B and the pixel size P or the corresponding least common multiple is a very large number such that the periodic noise pattern has a periodic dimension greater than the field dimension or wafer dimension.

Figure 11:
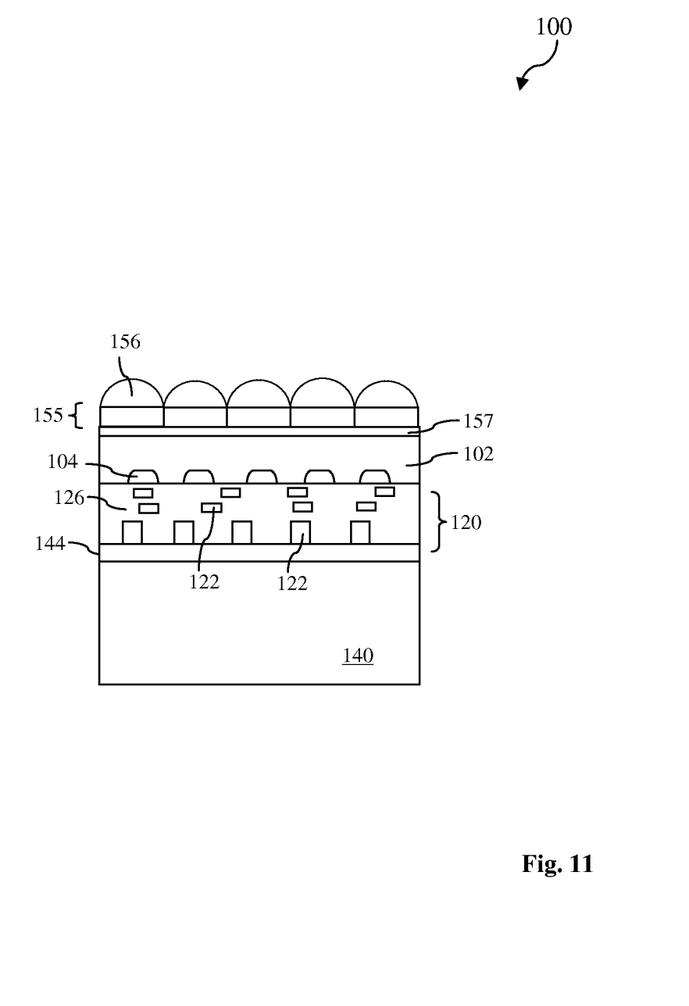

Other features may be formed before, during and/or after the formation of the p+ implanted backside surface. Referring to FIGS. 1 and 11, the method 50 may proceed to step 64 by forming color filters 155 on the backside surface of the semiconductor substrate 102 and micro-lenses 156 on the color filters 155. The color filters 155 are configured to be vertically aligned with the backside illuminated sensors 104, respectively, for imaging efficiency. The color filters 155 use various materials to selectively pass light having the wavelengths within certain ranges (such as red, yellow, and blue), respectively.

The micro-lenses 156 are further formed on the backside surface of the semiconductor substrate 102 and are aligned with the backside illuminated sensors 104, respectively. In one embodiment, the micro-lenses 156 are disposed on the color filters 155, as illustrated in the FIG. 11. In another embodiment, the micro-lenses 156 are interposed between the color filters 155 and the backside surface if the color filters are configured such that the backside illuminated light can be focused on the light-sensing regions. The micro-lenses 156 include a properly curved shape to effectively focus the illuminated light to the backside illuminated sensors 104, or specifically the image sensing regions. The micro-lenses 156 include a transparent material with minimized absorption of the illuminated light for enhanced imaging effect.

The semiconductor structure 100 may include a spacing layer 157 underlying the color filters 155 and providing a flat surface to the color filters 155. The spacing layer 157 includes a transparent material, such as silicon oxide. The semiconductor structure 100 may further include a passivation layer (not shown) disposed over the backside of the semiconductor substrate 102. The passivation layer may include silicon nitride and may further include silicon oxide. The method 50 may further include a step to open pads for electrical wiring. The pad opening may include lithography patterning and etching.

In the disclosed structure and method to make the same, the illuminated light during applications is not limited to visual light beam, and can be extended to other optical light such as infrared (IR), ultraviolet (UV), and other proper radiation beam. In another embodiment, the semiconductor substrate 102 may further include sensor isolation features properly chosen and designed to effectively reflect and/or absorb the diffracted light to reduce the crosstalk during the application of the backside illuminated sensors 104.

The semiconductor structure 100 may further include other integrated circuit devices designed to form a functional circuit to be coupled with the backside illuminated sensors 104. In one embodiment, the semiconductor structure 100 includes various transistors, such as a field effect transistor (FET). For example, the field effect transistor is a metal-oxide-semiconductor (MOS) field effect transistor.

Figure 12:
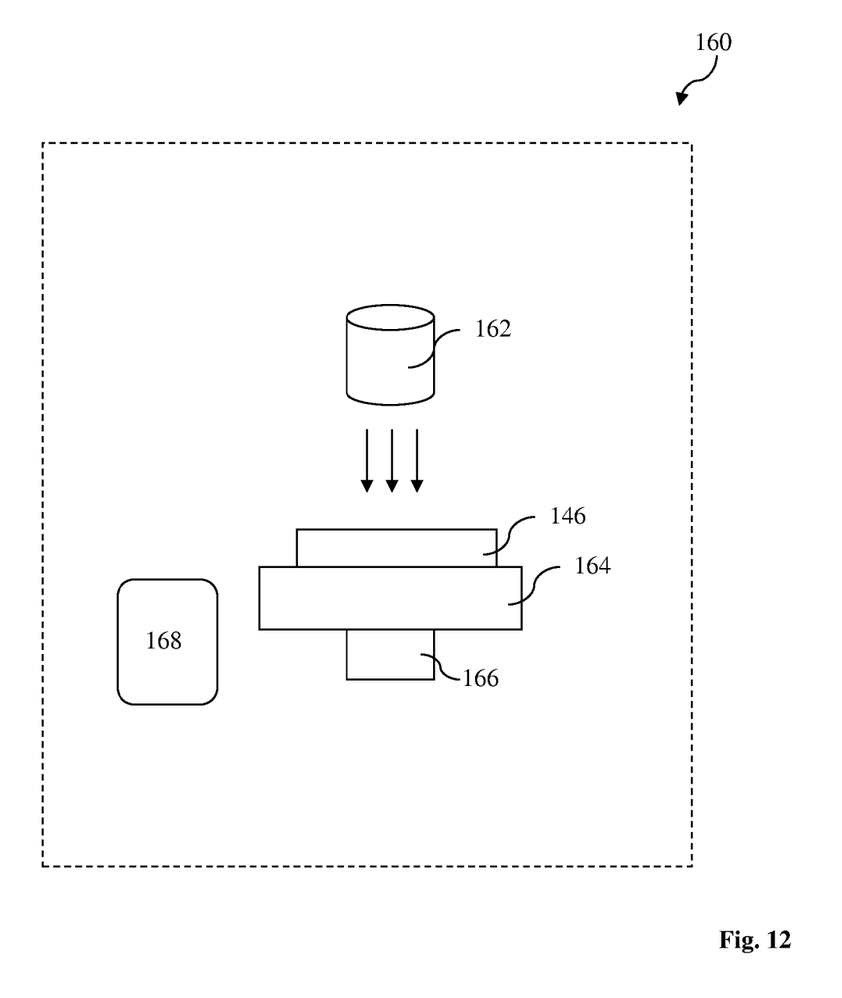
FIG. 12 illustrates a laser annealing apparatus in a schematic view and constructed according to aspects of the present disclosure in one embodiment.

FIG. 12 illustrates a laser annealing apparatus 160 in a schematic view and constructed according to aspects of the present disclosure in one embodiment. The laser annealing apparatus 160 is designed to perform a laser annealing process in the scan and vibration mode. The laser annealing system 160 includes a laser source 162 to emit laser light for annealing. In one embodiment, the pulsed solid state laser source uses a ytterbium-doped yttrium aluminium garnet (Yb:YAG). In one particular example, the laser source uses a Yb:YAG pulsed solid state laser source from DSPP Lasers Inc. In furtherance of the present embodiment, the pulsed solid state laser source may have a short wavelength of about 515 nm. The pulsed solid state laser source may have about 104 pulses per second or a pulse rate of about 10 KHz. The pulsed solid state laser source may have a pulse duration ranging between about 300 ns and about 500 ns. The pulsed solid state laser source may have an energy density ranging between about 0.5 J/cm$^2$ and about 3 J/cm$^2$.

The laser annealing apparatus 160 includes a wafer stage 164 configured to hold and secure a wafer such as the wafer 146. The wafer stage 164 is designed and configured to be operable to move transitionally in a first direction (x), a second direction (y) perpendicular to the first direction, and other directions. The wafer stage 164 is further designed to vibrate on a direction perpendicular to the scan direction enabled by a proper mechanism. In one embodiment, the laser annealing apparatus 160 may further include a piezoelectric crystal feature 166 configured to provide a vibration of the wafer stage 164 in a direction during a laser annealing process while the wafer stage 164 scans another direction perpendicular to the vibration direction. In one example, the vibration frequency is about 10 KHz or greater. Alternatively, other mechanisms may be implemented to achieve the vibration of the wafer stage 164. In another alternative, the laser source 162 is configured to vibrate to achieve the laser annealing in the scan and vibration mode.

The laser annealing apparatus 160 may further includes a control module 168 coupled with the wafer stage 164 and further coupled with the piezoelectric crystal feature 166 and control the both for the laser annealing in the scan and vibration mode.

Thus, the present disclosure provides a semiconductor structure. The method includes providing a semiconductor substrate having a front side and a backside, wherein the front side of the semiconductor substrate includes a plurality of backside illuminated imaging sensors; bonding a carrier substrate to the semiconductor substrate from the front side; thinning the semiconductor substrate from the backside; performing an ion implantation to the semiconductor substrate from the backside; performing a laser annealing process to the semiconductor substrate from the backside; and thereafter, performing a polishing process to the semiconductor substrate from the backside.

In one embodiment of the disclosed method, providing the semiconductor substrate includes forming the plurality of backside illuminated imaging sensors in the semiconductor substrate from the front side; and forming a plurality of interconnect features on the semiconductor substrate and electrically coupled with the plurality of backside illuminated imagining sensors. In another embodiment, providing the semiconductor substrate includes forming a set of backside illuminated imaging sensors in one field of the semiconductor substrate. In yet another embodiment, performing the laser annealing process includes simultaneously irradiating the set of backside illuminated imaging sensors using a laser apparatus capable of laser annealing in step and shot mode. The one field of the semiconductor substrate may include one die. Performing the laser annealing process may include scanning a laser beam to the semiconductor substrate in a first direction parallel to the semiconductor substrate and simultaneously vibrating the laser beam on a second direction parallel to the semiconductor substrate, where the second direction is perpendicular to the first direction. In another embodiment, performing the polishing process includes implementing a chemical mechanical polishing (CMP) process to remove a portion of the semiconductor substrate from the backside. In yet another embodiment, performing the ion implantation includes introducing p+ impurities into the backside of the semiconductor substrate with a depth D; performing the polishing process includes removing a portion of the semiconductor substrate from the backside with a thickness T; and the thickness T is substantially less than the depth D. In one example, a ratio of T/D is less than about 50%. The method may further include, after the polishing process: forming a plurality of color filter features on the backside of the semiconductor substrate and vertically aligned with the plurality of backside illuminated imaging sensors, respectively; and forming a plurality of micro-lenses overlying the plurality of color filter features and vertically aligned with the plurality of backside illuminated imaging sensors, respectively.

The present disclosure also provides another embodiment of a method including providing a device substrate having a front side and a backside, wherein the front side of the device substrate includes a plurality of backside illuminated imaging sensors; performing an ion implantation to the device substrate from the backside; and performing a laser annealing process to the backside of the device substrate by implementing a laser annealing process in a mode selected from a first mode of step and shot and a second mode of scan and vibration.

In the present method, performing the laser annealing process may include using a laser apparatus designed to be operable in the first mode to irradiate all imaging sensor pixels in one die of the device substrate by one shot. In one embodiment, the laser apparatus is operable to irradiate an area of about 2×2 mm$^2$ or greater by one shot. The performing of the laser annealing process may include using a laser apparatus designed to be operable with the second mode to irradiate the device substrate along a first direction while the device substrate vibrates in a second direction perpendicular to the first direction. In one example, the device substrate vibrates in the second direction with a frequency of about 10 kHz or greater. The method may further include performing a chemical mechanical polishing (CMP) process after performing the ion implantation. The method may further include: bonding a carrier substrate to the device substrate from the front side; and thinning down the device substrate from the backside.

The present disclosure also provides an embodiment of a laser annealing apparatus for laser annealing to a semiconductor substrate. The laser annealing apparatus includes a wafer stage configured to hold a wafer and operable to move transitionally along a first direction and a second direction perpendicular to the first direction; a laser source designed to emit laser light toward the wafer stage; and a driving module integrated with the wafer stage and enabling the wafer stage to move along the first direction and simultaneously vibrate along the second direction while the laser source emits the laser light to the wafer. In one example, the wafer stage is operable to vibrate along the second direction with a frequency of about 10 kHz or greater. In another example, the wafer stage includes a piezoelectric crystal configured to enable the wafer stage to vibrate with the frequency by piezoelectric effect.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
providing a semiconductor substrate having a front side and a backside, wherein the front side of the semiconductor substrate includes a plurality of backside illuminated imaging sensors;
bonding a carrier substrate to the semiconductor substrate from the front side;
thinning the semiconductor substrate from the backside;
performing an ion implantation to the semiconductor substrate from the backside;
performing a laser annealing process to the semiconductor substrate from the backside; and
thereafter, performing a polishing process to the semiconductor substrate from the backside.

2. The method of claim 1, wherein the providing the semiconductor substrate includes:
forming the plurality of backside illuminated imaging sensors in the semiconductor substrate from the front side; and
forming a plurality of interconnect features on the semiconductor substrate and electrically coupled with the plurality of backside illuminated imagining sensors.

3. The method of claim 2, wherein the providing the semiconductor substrate includes forming a set of backside illuminated imaging sensors in one field of the semiconductor substrate.

4. The method of claim 3, wherein the performing the laser annealing process includes simultaneously irradiating the set of backside illuminated imaging sensors using a laser apparatus capable of laser annealing in step and shot mode.

5. The method of claim 3, wherein the one field of the semiconductor substrate defines one die.

6. The method of claim 1, wherein the performing the laser annealing process includes scanning a laser beam to the semiconductor substrate in a first direction parallel to the semiconductor substrate and simultaneously vibrating the laser beam in a second direction parallel to the semiconductor substrate, the second direction being perpendicular to the first direction.

7. The method of claim 1, wherein the performing the polishing process includes implementing a chemical mechanical polishing (CMP) process to remove a portion of the semiconductor substrate from the backside.

8. The method of claim 1, wherein:
the performing the ion implantation includes introducing p+ impurities into the backside of the semiconductor substrate with a depth D;
the performing the polishing process includes removing a portion of the semiconductor substrate from the backside, the portion having a thickness T; and
the thickness T is substantially less than the depth D.

9. The method of claim 8, wherein a ratio of T/D is less than about 50%.

10. The method of claim 1, further comprising, after the polishing process:
forming a plurality of color filter features on the backside of the semiconductor substrate and vertically aligned with the plurality of backside illuminated imaging sensors, respectively; and
forming a plurality of micro-lenses overlying the plurality of color filter features and vertically aligned with the plurality of backside illuminated imaging sensors, respectively.

11. A method, comprising:
providing a device substrate having a front side and a backside, wherein the front side of the device substrate includes a plurality of backside illuminated imaging sensors;
bonding a carrier substrate to the device substrate from the front side;
thinning down the device substrate from the backside;
performing an ion implantation to the device substrate from the backside; and
performing a laser annealing process to the backside of the device substrate, the laser annealing process being performed in one of a step and shot mode and a scan and vibration mode.

12. The method of claim 11, wherein the performing the laser annealing process includes using a laser apparatus designed to be operable in the step and shot mode to irradiate all imaging sensor pixels in one die of the device substrate by one shot.

13. The method of claim 12, wherein the laser apparatus is operable to irradiate an area of about 2×2 $mm^2$ or greater by one shot.

14. The method of claim 11, wherein the performing the laser annealing process includes using a laser apparatus designed to be operable in the can and vibration mode to irradiate the device substrate along a first direction while the device substrate vibrates in a second direction perpendicular to the first direction.

15. The method of claim 14, wherein the device substrate vibrates in the second direction with a frequency of about 10 kHz or greater.

16. The method of claim 11, further comprising performing a chemical mechanical polishing (CMP) process after performing the ion implantation.

17. The method of claim 11,
wherein the step and shot mode comprises:
dividing a substrate into a plurality of fields, the fields being square and arranged adjacently in a first direction and a second direction;
positioning a laser apparatus over each field of the plurality of fields; and
exposing each field to at least one laser pulse from the laser apparatus.

18. A method, comprising:
providing a device substrate having a front side and a backside, wherein the front side of the device substrate includes a plurality of backside illuminated imaging sensors;
performing an ion implantation to the device substrate from the backside; and
performing a laser annealing process to the backside of the device substrate, the laser annealing process being a scan and vibrate process in which a laser beam is scanned along the backside in a scan direction and vibrates in a vibration direction, the vibration direction being orthogonal to the scan direction.

19. The method of claim 18, further comprising performing a chemical mechanical polishing process after performing the laser annealing process.

20. The method of claim 18, wherein the laser beam vibrates in the vibration direction with a frequency of about 10 kHz or greater.

* * * * *